United States Patent [19]

Soga et al.

[11] Patent Number: 5,867,809
[45] Date of Patent: Feb. 2, 1999

[54] ELECTRIC APPLIANCE, PRINTED CIRCUIT BOARD, REMAINED LIFE ESTIMATION METHOD, AND SYSTEM THEREOF

[75] Inventors: Tasao Soga, Fujisawa; Hanae Shimokawa, Kamakura; Masahide Harada; Tatsuya Suzuki, both of Yokohama; Yuji Ochiai, Oota-ku; Asao Nakano, Kamakura; Hiroyoshi Matsumura, Hidaka; Tsuneaki Kamei, Naka-gun, all of Japan

[73] Assignee: Hitachi, Ltd., Tokyo, Japan

[21] Appl. No.: 438,477

[22] Filed: May 10, 1995

[30] Foreign Application Priority Data

May 16, 1994 [JP] Japan ................................. 6-100450

[51] Int. Cl.$^6$ ................................................. G05D 23/00
[52] U.S. Cl. ......................... 702/130; 364/557; 340/588
[58] Field of Search ................................. 364/557, 143, 364/141, 551.01, 424.035, 424.04, 554; 377/20, 25, 26; 340/584, 588, 589, 602, 635, 643, 825.06, 825.15; 374/141, 142; 368/6, 9, 10, 11; 702/130

[56] References Cited

U.S. PATENT DOCUMENTS

| | | | |
|---|---|---|---|
| 3,931,619 | 1/1976 | Moore et al. | 340/228 R |
| 4,707,796 | 11/1987 | Calabro et al. | 364/552 |
| 4,908,775 | 3/1990 | Palusamy et al. | 364/508 |
| 5,230,055 | 7/1993 | Katz et al. | 395/750 |
| 5,239,485 | 8/1993 | Ohiba | 374/550 |
| 5,425,375 | 6/1995 | Chin et al. | 128/736 |
| 5,463,567 | 10/1995 | Boen et al. | 364/551.01 |

FOREIGN PATENT DOCUMENTS 60-206082  10/1985  Japan .

OTHER PUBLICATIONS

Fabrication and Reliability Evaluation of the Multi–Chip RAM Module, F. Kobayashi et al, Kanagawa Works, Hitachi, Ltd., pp. 425–429.

"Interfaces Between Fatique, Creep, and Fracture", S. Manson, Lewis Research Center, National Aeronautics and Space Administration, Cleveland, Ohio, USA, pp. 327–363.

"Fatigue: A Complex Subject—Some Simple Approximations", William M. Murray Lecture, Jul. 1965, Experimental Mechanics, pp. 193–226.

*Primary Examiner*—Thomas Peeso
*Attorney, Agent, or Firm*—Antonelli, Terry, Stout & Kraus, LLP

[57] ABSTRACT

The present invention relates to an electric appliance and a remaining life estimation system wherein the electric appliance having a printed circuit board on which at least LSI components are mounted includes an IC with sensor. The IC includes a time monitor for calculating the operation status which is a use condition affecting the life of a reusable component of the appliance, a temperature and humidity sensor for detecting at least temperature and humidity environmental conditions affecting the life of the reusable component, and a memory for storing the history of temperature and humidity in correspondence with the history of operation status. A control unit controls storage of the history of temperature and humidity which is detected by the temperature and humidity sensor so as to be stored in the memory in correspondence with the history of operation status which is calculated by the time monitor, and allows, when the remaining life of the component is evaluated so as to decide whether or not to reuse it, external reading of the history of temperature and humidity corresponding to the history of operation status from the memory.

17 Claims, 10 Drawing Sheets

FIG. 4

HISTORY DATA WITH RESPECT TO USE CONDITION
INCLUDING USE ENVIRONMENT

| DAY OR WEEK OR MONTH | OPERATION TIME (h) | TEMPERATURE (°C) | | | ON — OFF NUMBER OF TIME | HUMIDITY (%) |
|---|---|---|---|---|---|---|
| | | MAX | MIN | MEAN | | |
| 1 | 12 | 50 | 0 | 27 | 2 | |
| 2 | 10 | 20 | 5 | 15 | 4 | |
| 3 | 12 | 55 | 10 | 30 | 2 | |
| 4 | 10 | 25 | 5 | 18 | 4 | |
| 5 | | | | | | |
| ⋮ | | | | | | |

FIG. 10

HISTORY DATA OF MAIN PRINTED CIRCUIT BOARD

| | | | | | | | PRINTED CIRCUIT BOARD NO. |
|---|---|---|---|---|---|---|---|
| PRODUCT NO. | DAY OR WEEK OR MONTH | OPERATION TIME (h) | TEMPERATURE(°C) | | | ON — OFF NUMBER OF TIME | HUMIDITY (%) |
| | | | MIM | MAX | MEAN | | |
| A | 1 | 12 | 50 | 0 | 27 | 50 | |
| | 2 | 10 | 20 | 5 | 15 | 48 | |
| | ⋮ | | | | | | |
| | 838 | | | | | | |
| | SUM | | | | | 4000 | |
| B | 1' | 11 | 60 | 0 | 32 | 40 | |
| | 2' | 10 | 65 | 5 | 36 | 42 | |
| | ⋮ | | | | | | |
| | | | | | | | |
| | SUM | | | | | | |
| C | 1" | 11 | 55 | 2 | 29 | 49 | |
| | 2" | 10 | 60 | 3 | 33 | 35 | |
| | ⋮ | | | | | | |
| | | | | | | | |

# 5,867,809

ELECTRIC APPLIANCE, PRINTED CIRCUIT BOARD, REMAINED LIFE ESTIMATION METHOD, AND SYSTEM THEREOF

BACKGROUND OF THE INVENTION

The present invention relates to a recycling method for an electric appliance including a printed circuit board in which the use history can be determined for an object such as a printed circuit board on which an LSI and LSI module to be used in the electric appliance are mounted, a remaining life estimation method which can estimate the a remaining life of each of the LSI and LSI module mounted on the printed circuit board and which can decide whether or not to recycle them, and a system thereof.

For an electric appliance which fails partially and cannot be used, such appliances are conventionally discarded. However, by the "(Amended) Disposal of Waste Law" in July in 1992, social pressure has arisen to promote recycling of a reusable article for preserving both the natural environment and resource conservation.

Therefore, it is necessary to decide whether or not to reuse an electric appliance or a printed circuit board having a mounted LSI and LSI module forming part of the electric appliance, which have been collected for disposal of waste by a manufacturer from a user or which have been requested to be repaired by a manufacturer due to a failure. However, to decide whether or not to reuse, it is necessary to know an elapsed use time of the item including the use environment and frequency of use thereof, and to estimate a remaining life of each electric appliance or printed circuit board having a mounted LSI and LSI module forming part of the electric appliance. However, in a prior art (Japanese Patent Application Laid-Open 60-206082), these points are not taken into account. In the above prior art, to make the consistency of a test program perfect, a printed circuit board was structured so as to incorporate a storage element such as a ROM in the printed circuit board, so as to store the history information of the printed circuit board therein. As the aforementioned history data, (1) the model number indicating the kind of printed circuit board boy, a small change thereof, and an improved number, (2) the test program number indicating the kind of test program, (3) test result data, (4) the date of failure, failure status, and repair history of a component to be replaced, and (5) the production number of a unit to be assembled and use history such as used environment (no detailed description is given to this use history) are described.

SUMMARY OF THE INVENTION

An object of the present invention is to eliminate the difficulties mentioned above, and to provide an electric appliance or printed circuit board in which the use history of the electric appliance or printed circuit board on which an LSI and LSI module forming part of the electric appliance are mounted is stored in a memory, and a remaining life of each of electronic components such as the LSI and LSI module can be decided by reading the use history from the memory. Another object of the present invention is to provide a remaining life estimation method and a system thereof which store the use history of an electric appliance or printed circuit board on which an LSI and LSI module forming part of the electric appliance are mounted in a memory, and which decide the remaining life of each of electronic components such as the LSI and LSI module by reading the use history from the memory.

To accomplish the above objects, the present invention is an electric appliance (electric production) such as a household electric appliance, information apparatus, or industrial apparatus which has a printed circuit board on which at least LSI component is mounted. An IC with a sensor is provided inside or on said electric appliance (electric production), and said IC comprises a time monitor for calculating an operation status (operation time t, count of turning ON and OFF and frequency (cycle) f/day or week or month) which is a use condition affecting the life of an element (component) of said printed circuit board. The IC further comprises a temperature sensor for detecting at least a temperature (maximum temperature T max and temperature difference ΔT/day or week or month) which is an environmental condition affecting the life of said element (component), and a memory for storing a history of said temperature in correspondence with a history of said operation status. A control unit controls storage in said memory of the history of temperature which is detected by said temperature sensor in correspondence with the history of operation status which is calculated by said time monitoring means. Accordingly, one is able to read externally the history of temperature in correspondence with the history of operation status stored in said memory, when a remaining life of said element (component) is evaluated so as to decide whether or not to reuse it.

Further, the present invention is an electric appliance (electric production) such as a household electric appliance, information apparatus, or industrial apparatus which has a printed circuit board on which at least a LSI component is mounted, wherein an IC with a sensor is provided inside or on said electric appliance, said IC comprising a time monitor for calculating an operation status (operation time t, count of turning ON and OFF and frequency (cycle) f/day or week or month) which is a use condition for affecting the life of an element (component) forming part of said printed circuit board; the IC further comprises a temperature and humidity sensor for detecting at least a temperature (maximum temperature T max and temperature difference ΔT/day or week or month) and a humidity M which are environmental factors affecting the life of said element (component), a memory for storing a history of said temperature and humidity in correspondence with a history of said operation status. A control unit controls storage in said memory of the history of temperature and humidity which is detected by said temperature and humidity sensor in correspondence with the history of operation status which is calculated by said time monitoring means. Accordingly, one is able to read externally the history of temperature and humidity in correspondence with the history of operation status stored in said memory, when a remaining life of said element (component) is evaluated so as to decide whether or not to reuse it.

Still further, the prevent invention is an electric appliance which has a printed circuit board on which at least an LSI component is mounted, wherein an IC with a sensor is provided on said printed circuit board, said IC comprising a time monitor for calculating an operation status (operation time t, count of turning ON and OFF and frequency (cycle) f/day or week or month) which is a use condition affecting the life of an element (component) being formed said printed circuit board. The IC further comprises a temperature sensor for detecting at least a temperature (maximum temperature T max and temperature difference ΔT/day or week or month) which is a an environmental condition affecting the life of said element (component), and a memory for storing a history of said temperature in correspondence with a history of said operation status. A control unit controls storage in said memory of the history of temperature which is detected by said temperature sensor in correspondence with the history of operation status which is calculated by said time monitoring means. Accordingly, one is able to read externally the history of temperature correspondence with the history of operation status stored on said memory, when a remaining life of said element (component) is evaluated so as to decide whether or not to reuse it.

The present invention is also an electric appliance having a printed circuit board on which at least an LSI component is mounted, wherein an IC with a sensor is provided on said printed circuit board, said IC comprising a time monitor for calculating an operation status which is a use condition affecting the life of an element (component) forming part of said printed circuit board. The IC further comprises a temperature and humidity sensor for detecting at least temperature and humidity which are environmental conditions affecting the life of said element (component), and a memory for storing a history of said temperature and humidity in correspondence with a history of said operation status. A control unit controls storage in said memory of the history of temperature and humidity which is detected by said temperature and humidity sensor in correspondence with the history of operation status which is calculated by said time monitoring means. Accordingly, one is able to read externally the history of temperature and humidity in correspondence with the history of operation status stored on said memory, when a remaining life of said element (component) is evaluated so as to decide whether or not to reuse it.

The present invention is still further an electric appliance which has a printed circuit board on which at least LSI and LSI module components are mounted, wherein an IC with sensor is provided on said LSI module component, said IC comprising a time monitor for calculating an operation status which is a use condition affecting the life of an element (component) forming part of said printed circuit board, a temperature sensor for detecting at least a temperature which is an environmental condition affecting the life of said element (component), and a memory for storing a history of said temperature in correspondence with a history of said operation status. A control unit controls storage in said memory of the history of temperature which is detected by said temperature sensor in correspondence with the history of operation status which is calculated by said time monitoring means. Accordingly, one is able to read externally the history of temperature in correspondence with the history of operation status stored on said memory, when a remaining life of said element (component) is evaluated so as to decide whether or not to reuse it.

According to the present invention, in the aforementioned electric appliance, the time monitor, temperature sensor, memory, and control unit are preferably mounted on a substrate so as to constitute the aforementioned IC with sensor.

According to the present invention, in the aforementioned electric appliance, at least the memory and control unit are comprised within the LSI. The present invention is an electric appliance which has a printed circuit board on which at least the LSI and LSI module components are mounted, wherein an IC with sensor is provided on said LSI module component, said IC comprising a timer monitor for calculating an operation status which is a use condition affecting the life of an element (component) forming part of said printed circuit board. The IC further comprises a temperature and humidity sensor for detecting at least a temperature and humidity which are environmental factors affecting the life of said element (component), a memory for storing a history of said temperature and humidity in correspondence with a history of said operation status. A control unit controls storage in said memory of the history of temperature and humidity which are detected by said temperature and humidity sensor in correspondence with the history of operation status which is calculated by said time monitoring-means. Accordingly, one is able to read externally the history of temperature and humidity correspondence with the history of operation status stored on said memory, when a remaining life of said element (component) is evaluated so as to decide whether or not to reuse it.

The present invention is even further a printed circuit board on which at a least LSI component is mounted, wherein an IC with sensor is provided on said printed circuit board, said IC comprising a time monitor for calculating an operation status which is a use condition affecting the life of an element (component) forming part of said printed circuit board. The IC further comprises a temperature sensor for detecting at least the temperature which is an environmental factor affecting the life of said element (component), and a memory for storing a history of temperature in correspondence with a history of said operation status. A control unit controls storage in said memory of the history of temperature which is detected by said temperature sensor in correspondence with the history of operation status which is calculated by said time monitoring means. Accordingly, one is able to read externally the history of temperature correspondence with the history of operation status stored on said memory, when a remaining life of said element (component) is evaluated so as to decide whether or not to reuse it.

The present invention is additionally a printed circuit board on which at least a LSI component is mounted, wherein an IC with sensor is provided on said printed circuit board, said IC comprising a time monitor for calculating the operation status which is a use condition affecting the life of an element (component) forming part of said printed circuit board. The IC further comprises a temperature and humidity sensor for detecting at least the temperature and humidity which are environmental factors affecting the life of said element (component), and a memory for storing history of the temperature and humidity in correspondence with a history of operation status. A control unit controls storage in said memory of the history of temperature and humidity which is detected by said temperature and humidity sensor in correspondence with the history of operation status which is calculated by said time monitoring means. Accordingly, one is able to read externally the history of temperature and humidity correspondence with the history of operation status stored on said memory, when a remaining life of said element (component) is evaluated so as to decide whether or not to reuse it.

The present invention is a remaining life estimation method for estimating a remaining life of an object, which comprises the steps of reading out at least a history of temperature in correspondence with a history of operation status from an IC provided on the object or inside a production being installed on the object. The IC has stored therein the history of temperature which is an environmental factor affecting the life of the object, in correspondence with said history of operation status which is a use condition affecting the life of the object. Such information is used in deciding whether or not to reuse the object by evaluating a remaining life of the object in accordance with said read history of temperature in correspondence with history of operation status.

The present invention is also a remaining life estimation system for estimating a remaining life of an object, which comprises a reading out unit which reads out at least a history of temperature in correspondence with a history of operation status from an IC provided on the object or inside a production being installed on the object. The IC has stored therein the history of temperature which is an environmental factor affecting the life of the object in correspondence with said history of operation status which is a use condition affecting the life of the object. Further included is a calculation means for deciding whether or not to reuse the object by evaluating a remaining life of the object in accordance with said readout history of temperature in correspondence with the history of operation status.

The present invention is further a remaining life estimation system for estimating a remaining life of an object, which comprises of a code discrimination unit which reads (discriminate) a product number or lot number of the object or a production from the object, a reading out unit which reads out at least a history of temperature in correspondence with a history of operation status from an IC with sensor provided on the object or inside said production in correspondence with the product number or lot number discriminated by said code discrimination unit. The IC has stored therein the history of temperature which is an environmental factor affecting the life of the object in correspondence with said history of operation status which is a use condition affecting the life of the object. A calculation means is included for deciding whether or not to reuse the object by evaluating a remaining life of the object in correspondence with the product number or lot number discriminated by said code discrimination unit, in accordance with said readout history of temperature in correspondence with history of operation status.

According to the present invention, the aforementioned remaining life estimation system has a transport means for loading and transporting the aforementioned object sequentially.

Therefore, according to the present invention, when an electric appliance having a printed circuit board in which at least LSI components are mounted or a printed circuit board in which LSI components are mounted, is returned to the manufacturer thereof or collected by the manufacturer thereof, the history data of the environmental condition (particularly temperature and humidity, and the operational condition (a severe condition that the period of ON and OFF is short and the frequency f is high) have being operated by a user of the aforementioned electric appliance or the printed circuit board, can be known. The environmental condition and the operational condition affect the useful remaining life of each of the printed circuit board body, the joint (unctions) with an LSI or LSI module to be mounted. As a result, the remaining life of each of the printed circuit board body, the joints (unctions) with an LSI or LSI module to be mounted, and the LSI module, can be calculated, and reuse of an article which was subjected to severe environmental conditions and which has no required remaining life available, can be eliminated, and an article which has a viable and guaranteed remaining life, can be reused, and the recycling of each of the printed circuit board body, the joints, and the LSI module can be promoted for preserving both the natural environment and resource conservation.

BRIEF DESCRIPTION OF THE DRAWINGS

FIG. 4 is a drawing showing an embodiment of the history data of the used condition including the used environment which is detected by the IC with sensor relating to the present invention and stored in the memory.

FIG. 10 is a drawing showing the history data of the used condition including the used environment when a printed circuit board body is reused in different electric appliances.

DETAILED DESCRIPTION OF THE PREFERRED EMBODIMENTS

Figure 1A:
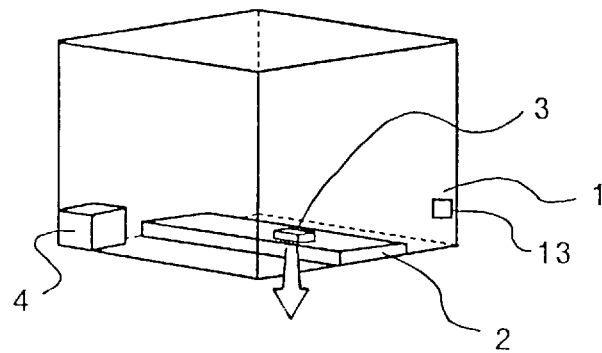
FIG. 1 is a drawing showing an embodiment of an electric appliance in which an IC with sensor for detecting and storing the history data of the used condition including the used environment relating to the present invention is installed in an LSI module, a printed circuit board in which an LSI or LSI module is mounted, or a cabinet.
Figure 1B:
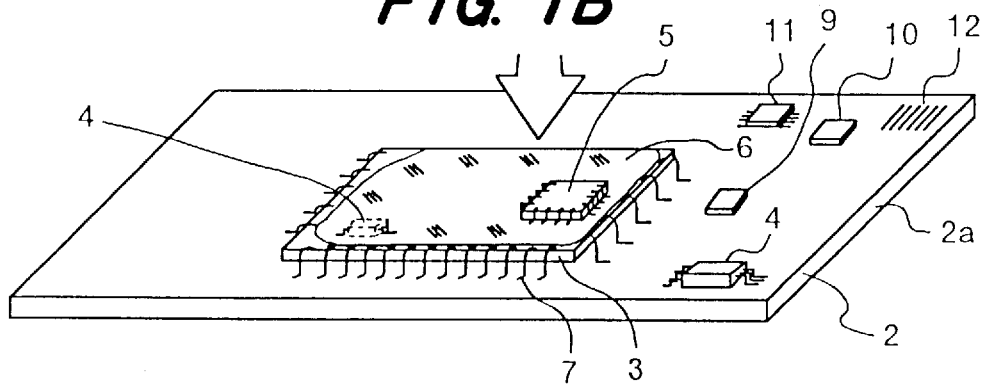

FIG. 1 is a drawing showing an embodiment of an electric appliance in which an IC with sensor for detecting and storing the history data of the used condition including the used environment relating to the present invention is installed in an LSI module, a printed circuit board on which an LSI or LSI module is mounted, or a cabinet.

A numeral 1 indicates a cabinet for an electric appliance such as a household electric appliance, information apparatus, or industrial apparatus in which a printed circuit board is installed. A numeral 2 indicates a printed circuit board which is generally installed in the cabinet 1 of the electric appliance. A numeral 3 indicates an LSI module which has a built-in LSI chip 5 which is generally used for a control circuit which is an essential part of the electric appliance in a substrate of ceramics or others. On the printed circuit board body 2a, the LSI module 3 having the built-in LSI chip 5 is joined by flat pack type lead joints 7 when the LSI module is mounted on a plane, and a resistor 9 and a capacitor 10 are mounted, and depending on the circumstances, an LSI 11 is also directly mounted. Namely, on the printed circuit board body 2a, the LSI 11, the components 9 and 10, and the LSI module 3 are mounted in high density. When the LSI module 3 is joined to the printed circuit board body 2a by the flat pack type lead joints 7 for flat mounting, repairs such as removal of the LSI module 3 or rejoining of the joints 7 can be done easily. To ensure high reliability furthermore, through hole joints having a pin structure as a joint structure may be used.

When an expensive logical high output LSI chip is mainly used in the LSI module 3, a ceramic package is often used because of heat dissipation. On the other hand, when a high output LSI for high frequency which is used for a workstation having a requirement of high speed processing, is mounted as an LSI module 3, a heat sink structure is required. However, as a reduction of the price of a package of an LSI module 3 is required, a method for sealing with resin 6 as shown in FIG. 1 will be started to be used even for a high class LSI module 3.

Furthermore, the LSI 11 which is directly joined to the printed circuit board body 2a by joints such as solder or an LSI 5 which is mounted on the LSI module 3 is guaranteed for 15 years as a life at a stationary load. The components such as the resistor and capacitor which are mounted to the printed circuit board 2 or the LSI module 3 are also designed and manufactured so as to have generally a life of 10 years or more.

Figure 9:
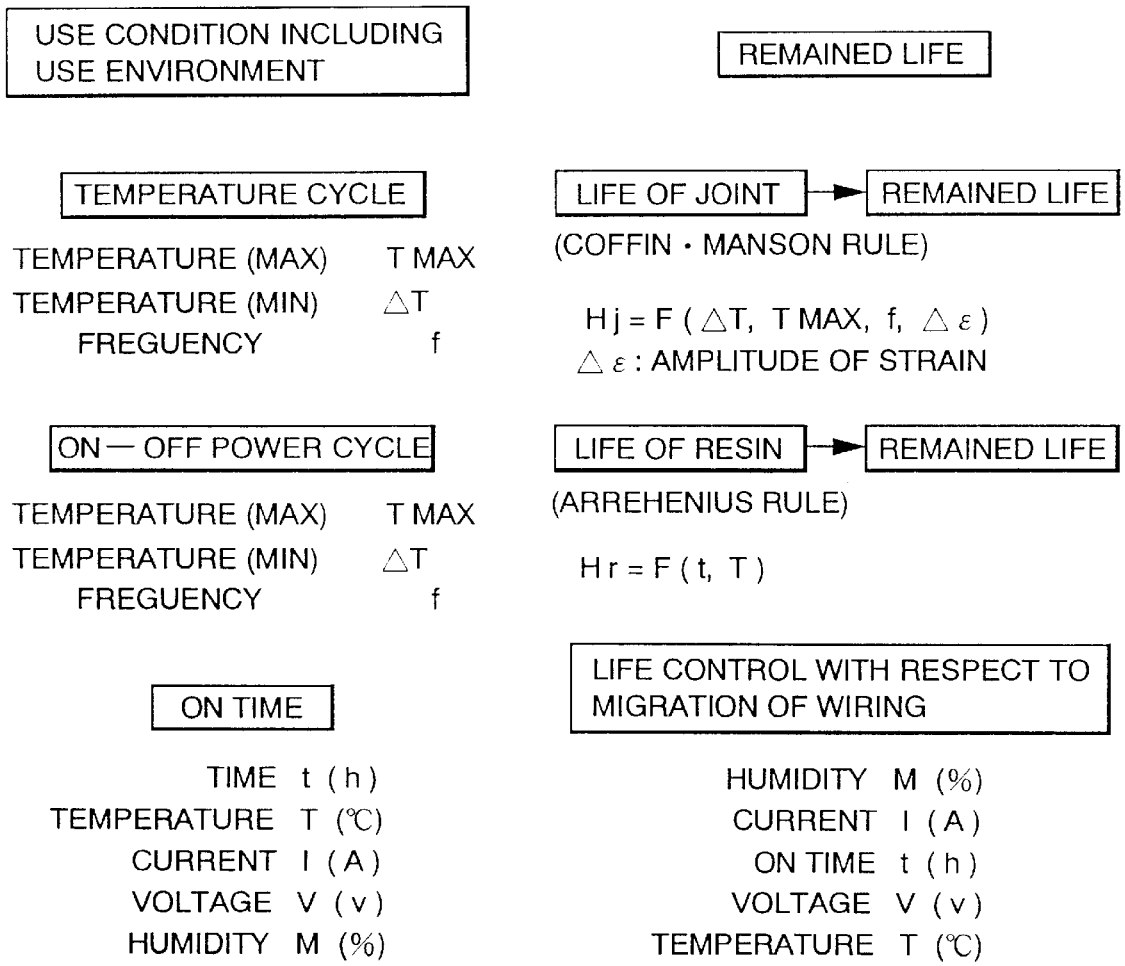
FIG. 9 is a drawing showing a rough relationship between the used condition including the used environment and the remaining life in each of migrations of the joints, resin, and wiring conductors which are calculated by the terminal device shown in FIG. 7.

As shown in FIG. 9, the life of each of the components 2a and 3 and the joints such as solder is changed extremely on the basis of the used condition including the used environment.

Namely, it is known that the life Nj of each of the joints such as solder for directly joining the LSI to the printed circuit board body 2a and the joints such as solder for joining the LSI module 3 to the printed circuit board body 2a is changed extremely according to the Coffin Manson Equation (for example, S. S. Manson: "Fatigue-complex subject some simple approximations", Experimental Mechanism, 5, pp. 193–226 (July, 1965)): Equation of LowCycle Fatigue indicated by the following equation (Formula 1) in the temperature cycle on the basis of the used condition including the used environment.

A symbol Nj indicates the life of the joints, f the temperature cycle number/day, $\Delta T$ the temperature difference between the highest temperature and the lowest temperature, T max the highest temperature, and $\Delta \epsilon$ the amplitude of strain (decided by the mechanical properties of the structure and material, a possible value by analysis by the finite element method).

$$Nj = F(\Delta T, T\ max, f, \Delta \epsilon) = C \cdot f^{1/3} \cdot (\Delta \epsilon)^{-2} \cdot \exp(E/\kappa T\ max) \quad \text{Formula 1}$$

where
C=a constant
E=activation energy of joints
$\kappa$=Boltzmann's constant ($\kappa = 8.6 \times 10^{-5}$ eV/K)

$$\Delta \epsilon = F(\Delta T) = (\alpha 1 - \alpha 2)\ \Delta T \cdot 1/h \quad \text{(Formula 2)}$$

where a symbol $\alpha 1$ indicates the thermal expansion coefficient of the one side material which is jointed by joints such as solder, a symbol $\alpha 2$ indicates the thermal expansion coefficient of the other side material which is jointed by joints such as solder, a symbol 1 indicates the length of joints such as solder, and a symbol h indicates the thickness of joints such as solder.

Also, on the ON-OFF power cycle which is the used condition including the used environment, though the concept (relation) of the frequency f for the life Nj is greatly different, the life Nj for each of the joints such as solder which joints the LSI directly to the printed circuit board body 2a and the joints such as solder which joints the LSI module 3 to the printed circuit board body 2a, is changed basically in the same way according to the temperature cycle.

There are the temperature cycle and ON-OFF power cycle as a used condition including used environment. In this case, the life of joints (degradation of joints) is compounded and varied.

Furthermore, as explained above, the LSI chip 5 of the LSI module 3 is sealed by resin (an organic material) and resin (an organic material) is used as an insulating material for the printed circuit board body 2a. However, the life Nr of these resins has a relation of Nr=F(t,T) between the use time (operation time) t which is the used condition including the used environment and the use temperature T on the basis of the Arrehenius rule. Therefore, as the use time (operation time) t which is the used condition including the used environment and the use temperature T vary extremely, the life Nr of resins also varies extremely.

Furthermore, when the wiring conductors of the LSI module 3 are exposed to the air or in the state close to it, the wiring conductors may be broken, about to be broken, or short-circuited or the insulation property is lowered by a phenomenon of migration and the life of the LSI module 3 becomes shorter than the desired one.

There are wiring conductors also on the printed circuit board body 2a and the wiring conductors are exposed to the air and caught in the insulating material. Therefore, also in the printed circuit board 2, the wiring conductors may be broken, about to be broken, or short-circuited or the insulation property is lowered by a phenomenon of migration and the life of the printed circuit board body 2a becomes shorter than the desired one.

In the LSI module 3 and the printed circuit board body 2a, the phenomenon of migration varies according to the used condition including the used environment (humidity, temperature, current flowing through wiring conductors, voltage applied between wiring conductors, energizing time for wiring conductors) and the life Nm varies extremely.

In the LSI module 3 and the printed circuit board body 2a, the degradation degree of the adhesion (adhesive property) between the wiring conductors and insulation material varies according to the used condition including the used environment (humidity, temperature, current flowing through wiring conductors, voltage applied between wiring conductors, energizing time for wiring conductors).

As to the electric appliance 1 or the printed circuit board 2 having the mounted LSI 11 and LSI module 3 constituting the electric appliance 1, which is collected (returned) for disposal of waste by a manufacturer from a user or requested repair to a manufacturer due to a failure, when there is a failure, the part is repaired. As to the other components (for example, the LSI module 3 and printed circuit board body 2a) and the joints such as solder (for example, joints such as solder of the LSI module and LSI 11 to the printed circuit board 2a), the remaining life is calculated from the history data of the used condition including the used environment. When the required value of the remaining life remains, the aforementioned components (for example, the LSI module 3 and printed circuit board body 2a) and the joints such as solder (for example, joints such as solder of the LSI module and LSI 11 to the printed circuit board 2a) are reused. When the required value of the remaining life does not remain, the component is replaced with a component having the remaining life. As to the joints such as solder, the joints are joined again so as to reuse the component. By doing this, the amount of components to be disposed of can be reduced, and the natural environment can be protected, and the resource can be conserved.

As explained above, at a collection factory (disassembly factory) where electric appliances are collected (returned) to a manufacture source thereof based on the disposal of waste from users, it is necessary to calculate each remaining life of components and joints such as solder from the history data of the used condition including the used environment and to decide whether or not to reuse them. The printed circuit board 2 installed in the electric appliance being collected (returned), is constituted by the components (for example, the LSI module 3 and printed circuit board body 2a) and the joints such as solder (for example, joints such as solder which connects the LSI module 3 and the LSI 11 to the printed circuit board body 2a).

However, the used environment at which an electric appliance is installed and the used condition under which a user actually uses it are in various states. On the other hand, as mentioned above, the life of each of components (for example, the LSI module 3 and printed circuit board body 2a) and joints such as solder (for example, joints such as solder of the LSI module and LSI 11 to the printed circuit board 2a) constituting the printed circuit board 2 varies extremely according to the used condition including the used environment.

Therefore, the present invention makes it possible to grasp the history of each of components and joints such as solder constituting the printed circuit board 2 installed in an electric appliance under the used condition including the used environment. Namely, as shown in FIG. 1, an IC 4 with sensor for detecting and storing the history data of the used condition including the used environment is installed in the neighborhood of the LSI chip 5 which generates heat most in the cabinet 1, or at the desired position on the printed circuit board body 2a, or on the LSI module 3.

Figure 2:
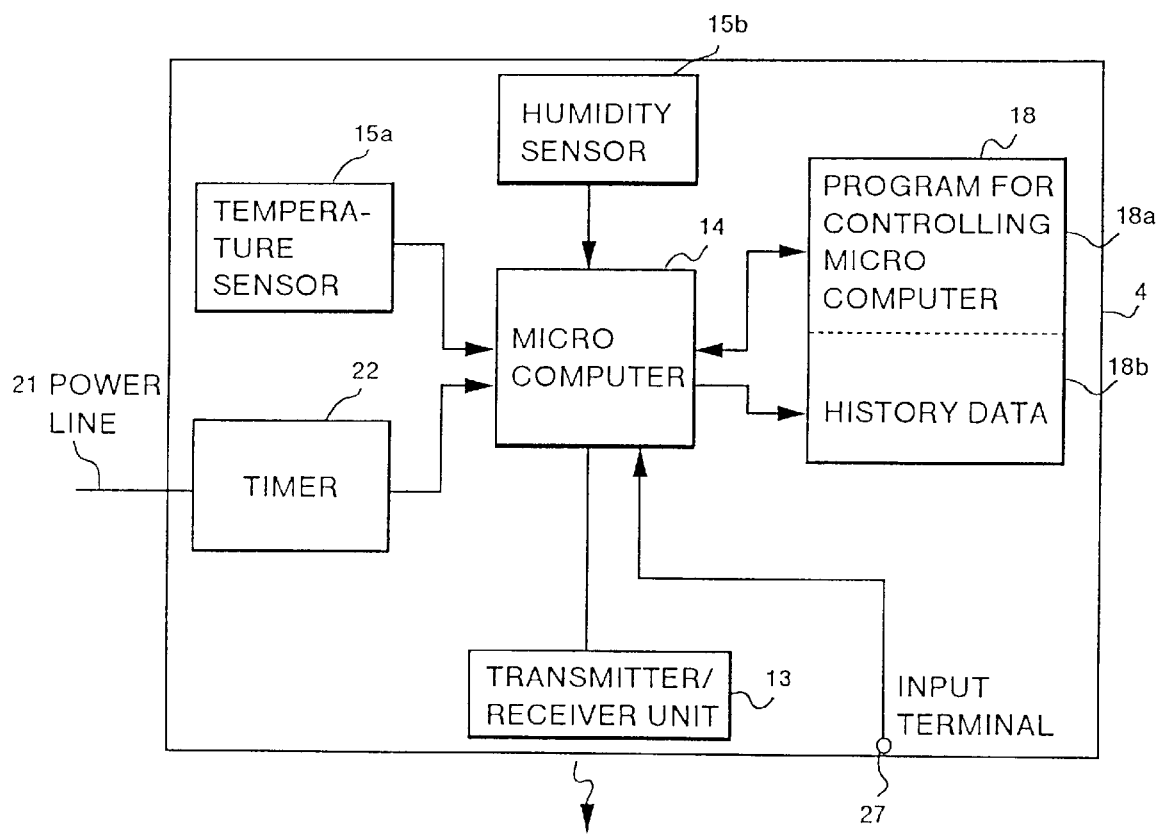
FIG. 2 is a drawing showing a specific exemplary construction of the IC with sensor relating to the present invention.
Figure 3:
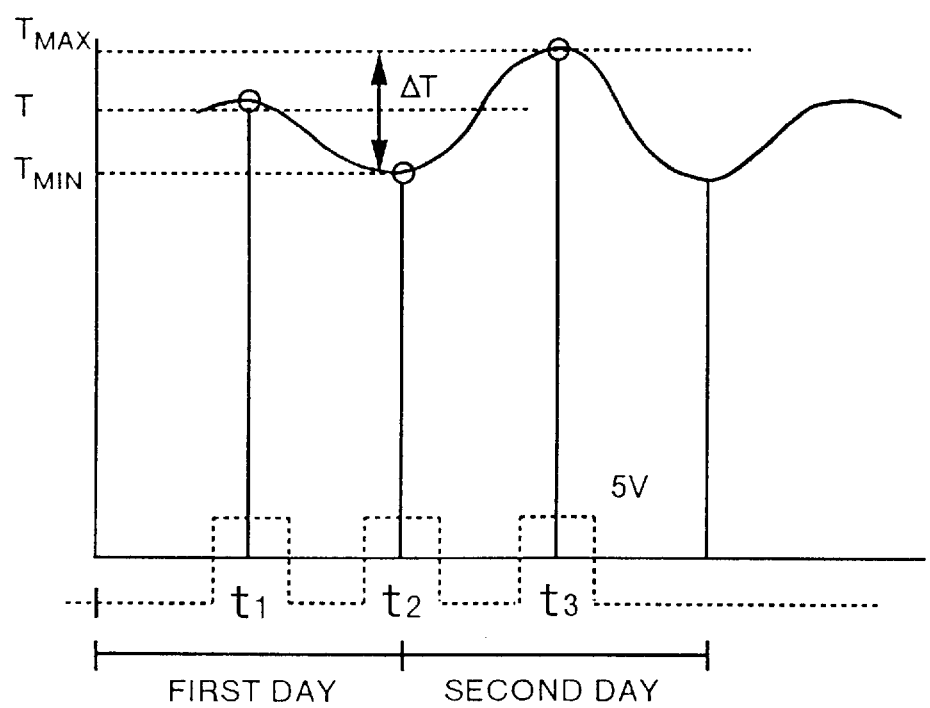
FIG. 3 is a drawing showing a temperature variation at a part which generates heat most when an electric appliance is turned ON and OFF per day.

The IC 4 with sensor is structured concretely as shown in FIG. 2. Namely, a numeral 22 indicates a timer which is connected to the printed circuit board 2, or the LSI module 3, or a power line 21 of the electric appliance and counts the operation time (use time when the power is turned ON), for example, per day, or week, or month and the count of turning ON and OFF under control to a microcomputer 14. The function of the timer 22 may be performed by the microcomputer 14. Namely, the microcomputer 14 may count the operation time (use time when the power is turned ON), for example, per day, or week, or month and the count of turning ON and OFF. A numeral 15a indicates a temperature sensor for measuring the temperature in the neighborhood of the LSI chip 5 which generates heat most, or at the desired position on the printed circuit board body 2a, or on the LSI module 3. It is most desirable to install the temperature sensor 15a in the neighborhood of a part which generates heat most (for example, the LSI chip 5, etc.) or of a part or component whose remaining life is calculated. It is required that the temperature range which is detected by the temperature sensor 15a is at least from about −30° C. to 100° C. The temperature sensor 15a can use a system for detecting the temperature by measuring a change in thermal strain, or a resistance system (for example, thermal resistance of pn junction) for detecting the temperature by measuring a change in electric resistance, or a system for detecting the temperature by using thermal radiation, or a thermocouple system detecting the temperature by using thermoelectromotive force. A numeral 15b indicates a humidity sensor which particularly detects the humidity which affects the life of a substrate having wiring conductors on the basis of the phenomenon of migration. Therefore, it is desirable that the humidity sensor 15b is installed inside the cabinet 1 of the electric appliance. The humidity sensor 15b may be an electric resistance system using the property that the electric resistance of a thin film of hygroscopic material varies with humidity. A numeral 14 indicates a microcomputer. Firstly, the microcomputer control program is written into a memory 18a from an input terminal 27. 18a and 18b consist of a nonvolatile memory such as ROM or EPROM. By the microcomputer 14, the mean temperature T, maximum temperature T max, minimum temperature T min, or temperature difference ΔT (=T max−T min) which is detected from the temperature sensor 15a and the mean humidity, or maximum humidity, or minimum humidity, or humidity change which is detected from the humidity sensor 15b are written and stored in the memory 18b as history data (shown in FIG. 4) of the used condition including the used environment as shown in FIG. 3 in correspondence with the operation time per day, or week, or month and the count of turning ON and OFF which are counted by the timer 15a on the basis of the microcomputer control program which is written into the memory 18a. From a viewpoint of the storage capacity of the memory 18b, the microcomputer 14 converts them to minimum history data of the used condition including the used environment which affects the life of each of the components and joints most and writes them into the memory 18b. Namely, when the temperature which is detected by the temperature sensor 15a and the humidity which is detected by the humidity sensor 15b are not different remarkably from the general used environment (temperature and humidity), it is possible to erase this history data of temperature and humidity by the microcomputer 14 so as to prevent it from writing into the memory 18a and to convert it to minimum history data of the used condition including the used environment. Needless to say, when a humidity change is not taken into account for life estimation, there is no need to install the humidity sensor 15b.

A numeral 13 indicates a transmitter/receiver unit consisting of a semiconductor laser beam source and a photo detector and is used so as to read the history data of the used condition including the used environment which is stored in the memory 18 via the microcomputer 14. When the history data of the used condition including the used environment which is stored in the memory 18b using an electromagnetic wave such as light is read via the microcomputer 14 like this, mechanical connection of a connector to each electric appliance 1 or printed circuit board 2 can be eliminated.

The IC with sensor 4 is not always an integrated one. The IC with sensor 4 may be structured as a package shape having a surface mounting terminal. It is desirable to make the IC with sensor 4 for storing the history data of the used condition including the used environment as small as possible. For example, it is possible to prepare a chip of LSI as an IC with sensor 4 and mount and use it on the printed circuit board body 2 as a package of QFP. It is also possible to supply a board as an IC with sensor 4 and mount and use the board on a substrate. It is also possible to prepare only the microcomputer 14 and the memory 18 on a substrate as a board of LSI chip as an IC with sensor 4 and to prepare another system of the temperature sensor 15a and the timer 22. It is also possible to use a surface mounting module which is incorporated in a substrate as an IC with sensor 4. The joints of a modularized IC with sensor 4 may use flat pack type leads. However, as the joints of a modularized IC with sensor 4 need to have a long life of about 15 years, it is preferable that the joints be highly reliable joints. When the IC with sensor 4 is mounted on the LSI module 3 or the printed circuit board body 2a, it may be mounted in the same way as the LSI 5. The IC with sensor 4 may consist of a module that a temperature sensor 23 of chip component, a humidity sensor 24 of chip component, a microcomputer 25, and a memory 26 are mounted on an alumina substrate.

Figure 5:
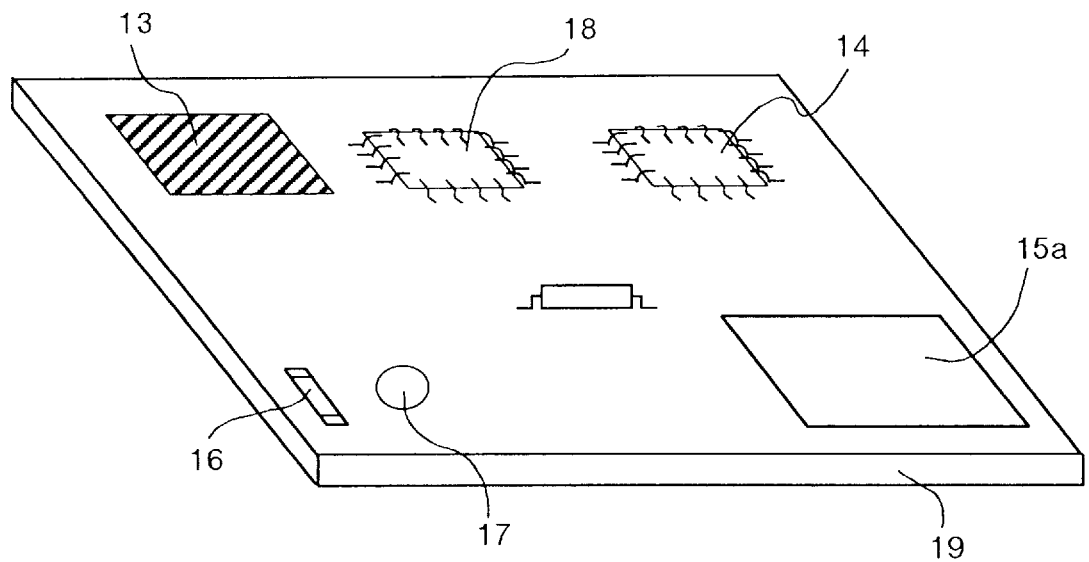
FIG. 5(a) is a perspective view showing an embodiment when the IC with sensor relating to the present invention consists of an IC card.
FIG. 5(b) is a drawing showing a partial cross section of FIG. 5(a).
Figure 5:

FIG. 5(a) shows an embodiment that the IC with sensor 4 consists of an IC card. The numerals which are the same as those shown in FIG. 2 indicate the same parts respectively. A numeral 16 indicates a terminal which is connected to the power line 21 of the printed circuit board body 2, or the LSI module 3, or the electric appliance. By a signal which is inputted from this terminal 16, the microcomputer 14 counts the operation time (use time when the power is turned ON), for example, per day, or week, or month and the count of turning ON and OFF. A numeral 17 indicates a battery. A numeral 18 consists of the memory 18a in which the microcomputer control program is stored and the memory 18b for storing the history data of the used condition including the used environment. The humidity sensor 15b may be installed. A numeral 19 indicates a thin plastic case in which the terminal 16 and the transmitter/receiver unit 13 are installed and the battery 17, the temperature sensor 15a, the microcomputer 14, and the memory 18 are housed. In the case of the card 4, the plastic case 19 can be simply set in and removed from the fixed position in the cabinet 1 of the electric appliance.

Furthermore, on the printed circuit board body 2a, a production number and production date (lot number for some products) 12 are marked in characters or bar 20 codes. Also on the cabinet 1 of the electric appliance, a production number and production date (lot number for some products) 13 are marked.

Figure 6:
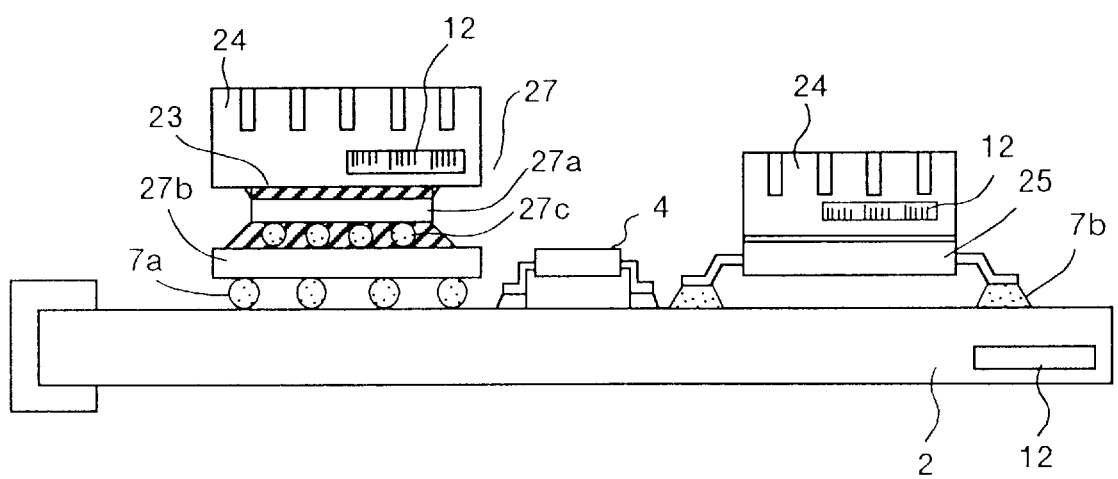
FIG. 6 is a front view showing a workstation printed circuit board in which a flip chip LSI package and an LSI-FP package are directly mounted on the printed circuit board body relating to the present invention.

In FIG. 6, the printed circuit board 2 for workstation is shown. On the printed circuit board 2, a flip chip LSI package 27 and an LSI-FP package 25 are mounted. The flip chip LSI package 27 is a high output LSI for high frequency. A high output LSI chip 27a for high frequency is connected to a chip carrier 27b by solder 27c. The chip carrier 27b is connected to the printed circuit board 2 by solder joints 7a. The chip back is cooled by air, so that a heat sink 24 is adhered and mounted to the back with solder or heat conductive adhesive 23. The heat sink 24 is mounted to the back of the LSI-FP package 25. The production number and production date (lot number for some products) 12 are marked in characters or bar codes in a space of each of the LSI packages 25 and 27. Also on the printed circuit board 2, the production number and production date (lot number for some products) 12 are marked in characters or bar codes in the same way as with the embodiment shown in FIG. 1.

In accordance with the structure as explained above, on the printed circuit board 2 being mounted LSI 11 and LSI module 3 and constituting the electric appliance 1 which has been returned from user by the disposal of waste or the request of repair due to a failure, the terminal device 8 can calculate the remaining life of each of the components (for example, the LSI module 3 and the printed circuit board body 2a) and the joints (for example, joints such as solder which connect the LSI module and LSI 22 to the printed circuit board body 2a) on the basis of the history data of the used condition including the used environment which is stored in the memory 18b, and can decide whether or not to reuse them based upon a remaining life being calculated. Calculation of the remaining life of each component and joint such as solder and decision of whether or not to reuse by the terminal device 8 will be explained hereunder.

Figure 7:
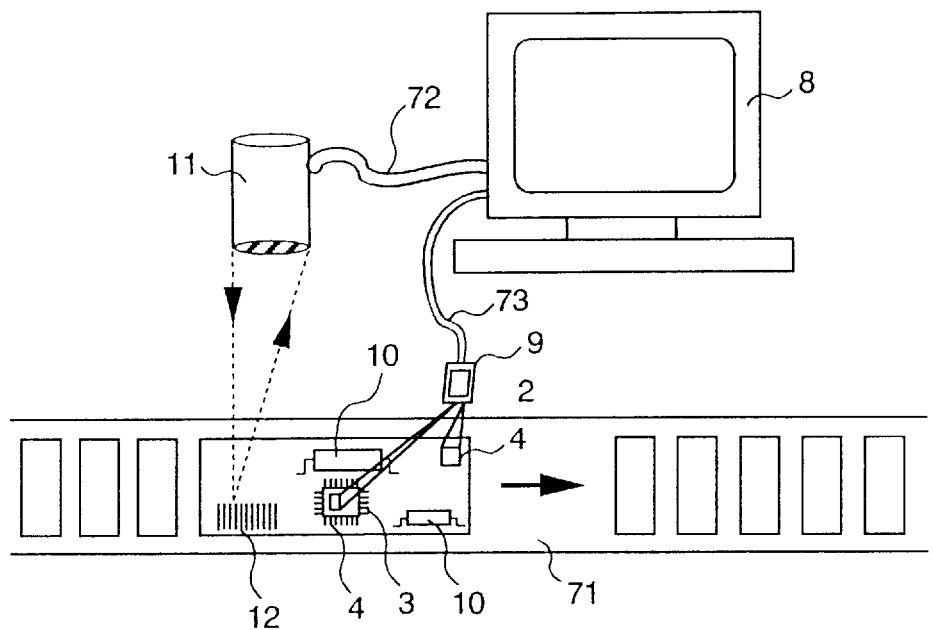
FIG. 7 is a drawing showing a system configuration for calculating the remaining life of each of the components and joints constituting an electric appliance collected by a collection factory (disassembly factory) relating to the present invention, or a printed circuit board which is disassembled from the electric appliance and for deciding whether or not to reuse them.

FIG. 7 is a drawing showing calculation of the remaining life of each of components 2a and 3 and joints 7 such as solder constituting the printed circuit board 2 installed in an electric appliance by using the terminal device 8 at a factory (disassembly factory) which is the manufacture source of the electric appliance and decision of whether or not to reuse them. Namely, FIG. 7 shows a case that the printed circuit board 2 is taken out from an electric appliance collected at a collection factory (assembly factory) and loaded on a transport device 71 such as a conveyer.

When the printed circuit board 2 is transported by the transport device 71 and arrives at the positions where an optical sensor and a transmitter/receiver unit 9 are installed, the production number and production date (lot number for some products) 12 which are marked on the printed circuit board body 2a are read by the optical sensor 11, and the transmitter/receiver unit 9 communicates with the transmitter/receiver unit 13 of the IC with sensor 4 installed on the printed circuit board body 2a using an electromagnetic wave such as light, and the history data of the used condition including the used environment which is stored in the memory 18b is read via the microcomputer 14.

Figure 8:
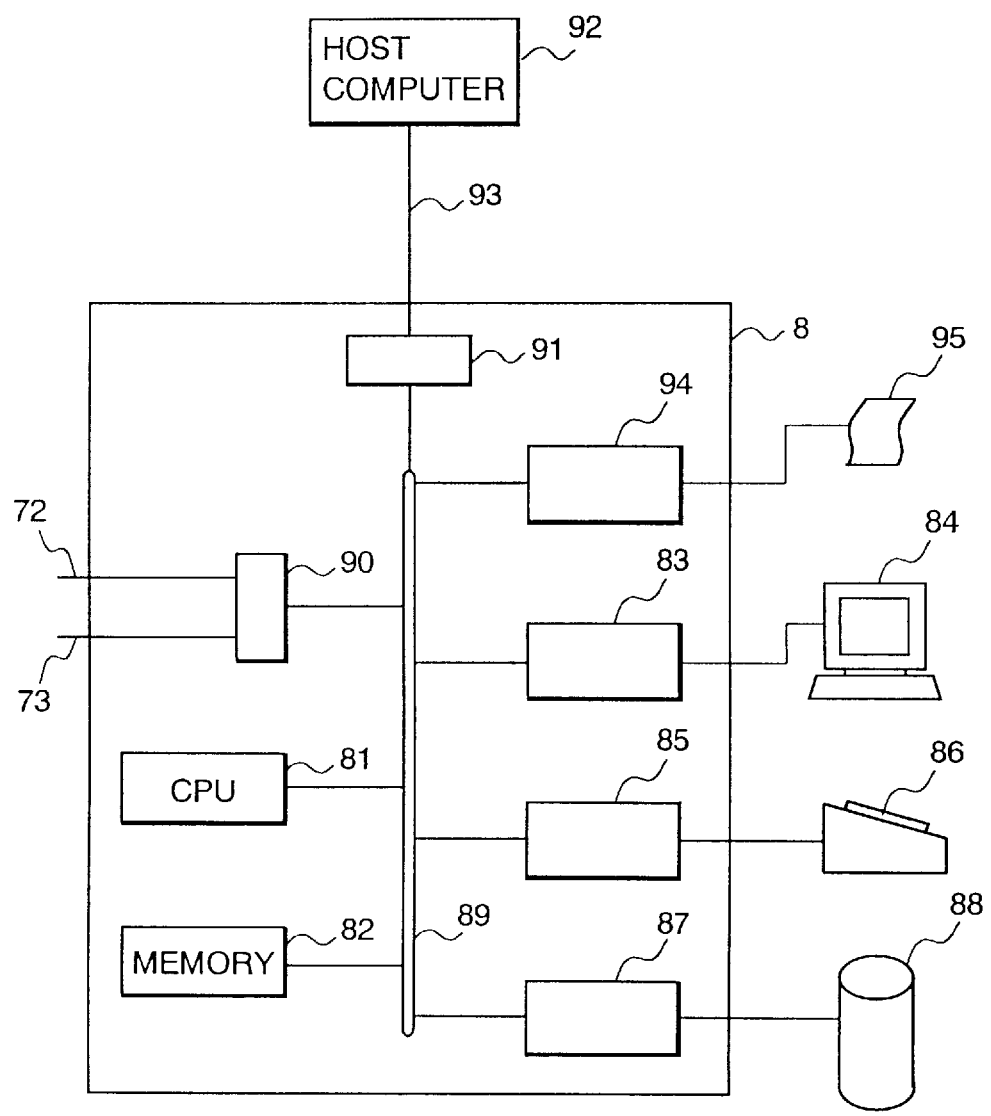
FIG. 8 is a drawing showing a specific exemplary construction of the terminal device shown in FIG. 7.

FIG. 8 shows a concrete constitution of the terminal device 8. Namely, a numeral 81 indicates a CPU which executes calculation of the remaining life of each of the components 2a and 3 and joints 7 such as solder and decision of whether or not to reuse them. A numeral 82 indicates a memory which has stored the programs and others. The CPU 81 executes the calculation of the remaining life of each of components 2a and 3 and joints 7 such a solder, and the decision of whether or not to reuse them, by the programs being stored in a memory 82. The programs indicates the relationship between the used condition including the used environment and the remaining life as shown in FIG. 9. Then, the programs calculate remaining life data by the joint life calculation equation program (for example Formula 1), the resin life calculation program, and the wiring conductor life calculation program. A numeral 84 indicates a display means consisting of a display for displaying data inputted from the optical sensor 11 and the transmitter/receiver unit 9, data inputted by an input means 86, and data processed by the CPU 81. A numeral 83 indicates a control circuit for controlling display on the display means 84. A numeral 86 indicates an input means consisting of the keyboard. A numeral 85 indicates a control circuit for controlling the input means 86. A numeral 88 indicates an external storage device being constructed of a hard disk and others. The external storage device has stored information including information of whether the components and joints mounted on the printed circuit board body 2a have been reused or not for the past in correspondence with the production number and production date (lot number for some products) being marked on the same printed circuit board body 2a, information of whether the components and joints constituting the electric appliance 1 have been reused or not for the past in correspondence with the production number and production date (lot number for some products) being marked on the same electric appliance 1, and data indicating the relationship between the used condition including the used environment and the guaranteed life being obtained by the severe life test for the components 2a and 3 and joints 7 such as solder. A numeral 87 indicates a control circuit for controlling the external storage device 88. A numeral 89 indicates a bus line. A numeral 91 indicates an interface for connecting to a host computer 92 for managing all produced electric appliances via a network 93. A numeral 90 indicates an interface for inputting data 72 detected by the optical sensor 11 and inputting data 73 received from the transmitter/receiver unit 9. A numeral 95 indicates an output means for outputting the remaining life or decision result of whether or not to reuse which is calculated by the CPU 81. A numeral 94 indicates a control circuit for controlling the output means 95.

Components and joints which are mounted on the printed circuit board 2 or the printed circuit board body 2a are reused. Therefore, the components and joints which are mounted on the printed circuit board 2 or the printed circuit board body 2a, as shown in FIG. 10, may be incorporated and used in an electric appliance A first, and then transferred and used in an electric appliance B, and next transferred and used in an electric appliance C. Therefore, when the IC with sensor 4 is mounted to the printed circuit board body 2a, even when the components and joints are transferred to the electric appliance C, the past history data of the used condition including the used environment of the electric appliance A and the electric appliance B is left stored in the memory 18b, so that when the history data is read from the memory 18b, the past history data of all the used conditions including the used environments can be obtained. However, when the components and joints which are mounted on the printed circuit board 2 or the printed circuit board body 2a are reused, it happens that the electric appliance being provided (mounted) the printed circuit board 2 being reused is changed from the original electric appliance to the other (new) electric appliance.

Therefore, in a case where the IC with sensor 3 is installed in another position being different from the printed circuit board 2, whenever the other (new) electric appliance being provided (mounted) with the printed circuit board 2 being reused is changed, it is necessary to have read out the history data of the used condition including the used environment of the original electric appliance from the memory 18b of the IC with sensor 4 installed in the original electric appliance by the transmitter/receiver unit 9 and to store the history data in the external storage device 88 of the terminal device in advance.

The CPU 81 of the terminal device 8 calculates the remaining life which can be guaranteed on the basis of the degradation degree relating to each of components 2a and 3 and joints, against the guaranteed life which is stored in the external storage device 88. Such is calculated on the basis of the history data of the used condition including the used environment (which is read out and inputted from the memory 18b by the transmitter/receiver unit 9) in correspondence with the data 72 relating to the production number and production data (lot number for some products) 12 marked on the printed circuit board body 2a (which is inputted from the optical sensor 11), by the program stored in the memory, and such calculation decides (evaluates) whether the guaranteed remaining life being calculated is a sufficient useable remaining life or not, and outputs the decision (evaluation) result to the display means 84 or the output means 95. The program executes calculation of the remaining life of each of the components 2a and 3 and joints 7 such as solder, and decision of whether or not to reuse them. Then, the program further executes the joint life calculation equation program (for example, Formula 1), the resin life calculation program, and the wiring conductor life calculation program on the basis of migration which are mentioned above. When the remaining life which can be guaranteed is to be calculated, the severe life test data stored in the external storage device 88 may be referred to on the basis of the history data of the used condition including the used environment. Since the memory capacity of the memory 18b of the IC with sensor 4 is limited, it is necessary to store the remaining life which is calculated by the CPU 81 in correspondence with the production number marked on the printed circuit board body 2a and can be guaranteed on the basis of the degradation degree relating to each of the components 2a and 3 and joints in the external storage device 88.

As a result of this decision (evaluation), when the remaining life which can be guaranteed satisfies the required remaining life, the components 2a and 3 and joints are reused. When the remaining life which can be guaranteed does not satisfy the required remaining life, the components 2a and 3 and joints are replaced with new ones.

When the IC with sensor 4 is installed in the cabinet 1 of the electric appliance instead of the printed circuit board body 2a or the LSI module 3, it is desirable that the electric appliance 1 is loaded and transported on the transport device 71 and the CPU 81 of the terminal device 8 calculates the remaining life of each of the components 2a and 3 and joints 7 such as solder constituting the printed circuit board 2 when the aforementioned printed circuit board 2 is mounted in correspondence with the data 72 relating to the production number and production date (lot number for some products) 12 marked on the electric appliance 1 which is inputted from the optical sensor 11 and decides whether or not to reuse them in the same way.

It is also possible that a detector which can measure the degradation degree due to a change with time is installed in the electric appliance 1 or the printed circuit board body 2a in place of the IC with sensor 4, and the degradation degree is measured by an external sensor at a collection factory (disassembly factory) (for example, resin which indicates the degradation degree of bulk material is attached, and the degradation degree is detected by half value width evaluation of X-ray transmission, or by reflection of a laser beam, or by reflection and transmission of an ultrasonic wave, and the remaining life is measured), and the terminal device 8 calculates the remaining life which can be guaranteed on the basis of the degradation degree relating to each of the components 2a and 3 and joints and decides whether or not to reuse them. In this case, to make the surface of the part to be detected constant, it is devised so as to attach a cover usually so as to prevent the surface from soil and remove it at the time of inspection. The degradation degree of bulk material is a function mainly of temperature and time, so that it is not necessary to check the temperature and time always. Although this is a simple evaluation method, it has an advantage that a true degradation degree can be grasped. The lot number is recorded on the bulk sensor and the bulk sensor can be removed from the electric appliance 1 so as to be inspected in a batch together with other bulk sensors.

There is a problem imposed that although there is data by the acceleration test, data of reliability in the actual field is insufficient. According to the present invention, a correspondence between acceleration and an actual environmental load can be established, and the life cycle of a product is made clear, and almost a most suitable reliability design is obtained. The remaining life of each of a product and components constituting the product can be evaluated quantitatively. Therefore, most suitable decision of minimum energy and cost by remaining life evaluation of each component and energy evaluation (lost energy in the case of disposal of waste) is made possible.

The cost is important for recycling of mass products and recycling of mass products can be industrialized by shortening of the setup time, shortening of the repair time, automation of evaluation and decision, and adoption of an assembly line system.

We claim:

1. An electric appliance having a printed circuit board on which at least one LSI component is mounted, wherein an IC with sensor is provided inside or on said electric appliance, said IC with sensor comprising:

a time monitor for calculating an operation status which is a use condition affecting the life of a component forming part of said printed circuit board, a temperature sensor for detecting at least a temperature environmental condition affecting the life of said component, a memory for storing a history of said temperature in correspondence with a history of said operation status, a control unit which controls storage in said memory of the history of temperature which is detected by said temperature sensor in correspondence with the history of operation status which is calculated by said time monitor, and which allows external reading of the history of temperature in correspondence with the history of operation status from said memory, when a remaining life of said component is evaluated so as to decide whether or not to reuse it and whereby said component can be evaluated for reuse by evaluating the remaining life thereof in accordance with a life of said component which is calculated by a predetermined life equation of said component being indicated with a relation between the history of temperature and the history of operation status, the relation being obtained by external reading of the history of temperature in correspondence with the history of operation status from said memory.

2. An electric appliance according to claim 1, wherein said IC with sensor is structured by mounting said time monitor, temperature sensor, memory, and control unit inside or on a card.

3. An electric appliance according to claim 1, wherein said IC with sensor is structured by mounting said time monitor, temperature sensor, memory, and control unit on a substrate.

4. An electric appliance having a printed circuit board on which at least one LSI component is mounted, wherein an IC with sensor is provided inside or on said electric appliance, said IC with sensor comprising a time monitor for calculating an operation status which is a use condition affecting the life of a component forming part of said printed circuit board, a temperature and humidity sensor for detecting at least temperature and humidity environmental conditions affecting the life of said element component, a memory for storing a history of said temperature and humidity in correspondence with a history of said operation status, a control unit which controls storage in said memory of the history of temperature and humidity which is detected by said temperature and humidity sensor in correspondence with the history of operation status which is calculated by said time monitor, and which allows external reading of the history of temperature and humidity in correspondence with the history of operation status from said memory, when a remaining life of said component is evaluated so as to decide whether or not to reuse it, and whereby said component can be evaluated for reuse by evaluating the remaining life thereof in accordance with a life of said component which is calculated by a predetermined life equation of said component being indicated with a relation between the history of temperature and humidity and the history of operation status, the relation being obtained by external reading of the history of temperature and humidity in correspondence with the history of operation status from said memory.

5. An electric appliance having a printed circuit board on which at least LSI components are mounted, and an IC with sensor which comprises:

a time monitoring means for calculating an operation status which is a use condition affecting the life of reusable components of said appliance, a temperature and humidity sensor for detecting at least temperature and humidity environmental conditions affecting the life of said reusable components of said appliance, a memory for storing the history of temperature and humidity in correspondence with the history of operation status, a control means which controls storage of the history of temperature and humidity in correspondence with the history of operation status in said memory, and which allows, when a remaining life of said reusable components is evaluated so as to decide whether or not to reuse, external reading of the history of temperature and humidity corresponding to the history of operation status from said memory, and whereby said reusable components can be evaluated for reuse by evaluating the remaining life thereof in accordance with a life of said component which is calculated by a predetermined life equation of said component being indicated with a relation between the history of temperature and humidity and the history of operation status, the relation being obtained by external reading of the history of temperature and humidity in correspondence with the history of operation status from said memory.

6. An electric appliance having a printed circuit board on which at least one LSI component is mounted, wherein an IC with sensor is provided on said printed circuit board, said IC with sensor comprising:

a time monitor for calculating an operation status which is a use condition affecting the life of a component forming part of said printed circuit board, a temperature sensor for detecting at least a temperature environmental condition affecting the life of said component, a memory for storing a history of said temperature in correspondence with a history of said operation status, a control unit which controls storage in said memory of the history of temperature which is detected by said temperature sensor in correspondence with the history of operation status which is calculated by said time monitor, and which allows external reading of the history of temperature in correspondence with the history of operation status from said memory, and whereby said component can be evaluated for reuse by evaluating the remaining life thereof in accordance with a life of said component which is calculated by a predetermined life equation of said component being indicated with relation between the history of temperature and the history of operation status, the relation being obtained by external reading of the history of temperature in correspondence with the history of operation status from said memory.

7. An electric appliance having a printed circuit board on which at least one LSI component is mounted, wherein an IC with sensor is provided on said printed circuit board, said IC with sensor comprising:

a time monitor for calculating an operation status which is a use condition affecting the life of a component forming part of said printed circuit board, a temperature and humidity sensor for detecting at least temperature and humidity environmental conditions affecting the life of said component, a memory for storing a history of said temperature and humidity in correspondence with a history of said operation status, a control unit which controls storage in said memory of the history of temperature and humidity which is detected by said temperature and humidity sensor in correspondence with the history of operation status which is calculated by said time monitor and which allows external reading of the history of temperature and humidity in correspondence with the history of operation status from said memory, when a remaining life of said component is evaluated so as to decide whether or not to reuse it, and whereby said component can be evaluated for reuse by evaluating the remaining life thereof in accordance with a life of said component which is calculated by a predetermined life equation of said component being indicated with a relation between the history of temperature and humidity and the history of operation status, the relation being obtained by external reading of the history of temperature and humidity in correspondence with the history of operation status from said memory.

8. An electric appliance having a printed circuit board on which at least LSI and LSI module components are mounted, wherein an IC with sensor is provided on said LSI module component, said IC with sensor comprising:

a time monitor for calculating an operation status which is a use condition affecting the life of a component forming part of said printed circuit board, a temperature sensor for detecting at least a temperature environmental condition affecting the life of said component, a memory for storing a history of said temperature in correspondence with a history of said operation status, a control unit which controls storage in said memory of the history of temperature which is detected by said temperature sensor in correspondence with the history of operation status which is calculated by said time monitor, and which allows external reading of the history of temperature in correspondence with the history of operation status from said memory, when a remaining life of said component is evaluated so as to decide whether or not to reuse it, and whereby said component can be evaluated for reuse by evaluating the remaining life thereof in accordance with a life of said component which is calculated by a predetermined life equation of said component being indicated with a relation between the history of temperature and the history of operation status, the relation being obtained by external reading of the history of temperature in correspondence with the history of operation status from said memory.

9. An electric appliance having a printed circuit board on which at least LSI and LSI module components are mounted, wherein an IC with sensor is provided on said LSI module component, said IC with sensor comprising:

a time monitor for calculating operation status which is a use condition affecting the life of a component forming part of said printed circuit board, a temperature and humidity sensor for detecting at least temperature and humidity environmental conditions affecting the life of said component, a memory for storing a history of said temperature and humidity in correspondence with a history of said operation status, a control unit which controls storage in said memory of the history of temperature and humidity which is detected by said temperature and humidity sensor in correspondence with the history of operation status which is calculated by said time monitor, and which allows external reading of the history of temperature and humidity in correspondence with the history of operation status from said memory, when a remaining life of said component is evaluated so as to decide whether or not to reuse it, and whereby said component can be evaluated for reuse by evaluating the remaining life thereof in accordance with a life of said component which is calculated by a predetermined life equation of said component being indicated with a relation between the history of temperature and humidity and the history of operation status, the relation being obtained by external reading of the history of temperature and humidity in correspondence with the history of operation status from said memory.

10. A printed circuit board on which at least one LSI component is mounted, wherein an IC with sensor is provided on said printed circuit board, said IC with sensor comprising:

a time monitor for calculating an operation status which is a use condition affecting the life of a component forming part of said printed circuit board, a temperature sensor for detecting at least a temperature environmental condition affecting the life of said component, a memory for storing a history of said temperature in correspondence with a history of said operation status, a control unit which controls storage in said memory of the history of temperature which is detected by said temperature sensor in correspondence with the history of operation status which is calculated by said time monitor, and which allows external reading of the history of temperature in correspondence with the history of operation status from said memory, when a remaining life of said component is evaluated so as to decide whether or not to reuse it, and whereby said component can be evaluated for reuse by evaluating the remaining life thereof in accordance with a life of said component which is calculated by a predetermined life equation of said component being indicated with a relation between the history of temperature and the history of operation status, the relation being obtained by external reading of the history of temperature in correspondence with the history of operation status from said memory.

11. A printed circuit board on which at least one LSI component is mounted, wherein an IC with sensor is provided on said printed circuit board, said IC with sensor comprising:

a time monitor for calculating an operation status which is a use condition affecting the life of a component forming part of said printed circuit board, a temperature and humidity sensor for detecting at least temperature and humidity environmental conditions affecting the life of said component, a memory for storing a history of temperature and humidity in correspondence with a history of said operation status, and a control unit which control storage in said memory of the history of temperature and humidity which is detected by said temperature and humidity sensor in correspondence with the history of operation status which is calculated by said time monitor, and which allows external reading of the history of temperature and humidity in correspondence with the history of operation status from said memory, when a remaining life of said component is evaluated so as to decide whether or not to reuse it, and whereby said component can be evaluated for reuse by evaluating the remaining life thereof in accordance with a life of said component which is calculated by a predetermined life equation of said component being indicated with a relation between the history of temperature and humidity and the history of operation status the relation being obtained by external reading of the history of temperature and humidity in correspondence with the history of operation status from said memory.

12. A remaining life estimation method for estimating a remaining life of an object, comprising the steps of, reading out at least a history of temperature in correspondence with a history of operation status from an IC with a sensor provided on the object or inside an apparatus including the object, said IC storing therein said history of temperature which is an environmental condition affecting the life of the object in correspondence with said history of operation status which is a use condition affecting the life of the object, and deciding whether or not to reuse the object by evaluating a remaining life of the object in accordance with a life of said object which is calculated by a predetermined life equation of said object being indicated with a relation between the history of temperature and the history of operation status, the relation being obtained in accordance with said read history of temperature in correspondence with said read history of operation status.

13. A remaining life estimation method according to claim 12, wherein said object is at least partly formed of a printed circuit board.

14. A remaining life estimation system for estimating a remaining life of an object, comprising, a reading out unit which reads out at least a history of temperature in correspondence with a history of an operation status from an IC with a sensor provided on the object or inside an apparatus including the object, said IC storing therein said history of temperature which is an environmental condition affecting the life of the object in correspondence with said history of operation status which is a use condition affecting the life of the object, and calculation means for deciding whether or not to reuse the object by evaluating a remaining life of the object in accordance with a life of said object which is calculated by a predetermined life equation of said object on basis of a relation between the history of temperature and the history of operation status, the relation being obtained in accordance with said readout history of temperature in correspondence with said readout history of operation status.

15. A remaining life estimation system according to claim 14, wherein said object is at least partly formed of a printed circuit board.

16. A remaining life estimation system for estimating a remaining life of an object, comprising, a code discrimination unit which reads a product number or lot number of the object or an apparatus including the object, a reading out unit which reads out at least a history of temperature in correspondence with a history of an operation status from an IC with a sensor provided on the object or said apparatus in correspondence with said product number or lot number discriminated by said code discrimination unit, said IC with sensor storing therein said history of temperature which is an environmental condition affecting the life of the object in correspondence with said history of operation status which is a use condition affecting the life of the object, and calculation means for deciding whether or not to reuse the object by evaluating a remaining life of the object in accordance with a life of said object which is calculated by a predetermined life equation of said object on basis of a relation between the history of temperature and the history of operation status, the relation being obtained in accordance with said readout history of temperature in correspondence with said read out history of operation status by referring a past history data of used condition of the object, the past history data of the object being stored in a storage device (88) in correspondence with produce number or lot number discriminated by said code discrimination unit.

17. A remaining life estimation system according to claim 16, wherein said object is at least partly formed of a printed circuit board.

* * * * *